United States Patent
Lang et al.

(10) Patent No.: US 7,554,112 B1
(45) Date of Patent: Jun. 30, 2009

(54) ORGANIC ELECTRONIC DEVICE AND PROCESSES FOR FORMING AND USING THE SAME

(75) Inventors: Charles D. Lang, Goleta, CA (US); Johann Thomas Trujillo, Goleta, CA (US); Nigel Morton Coe, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 435 days.

(21) Appl. No.: 11/321,976

(22) Filed: Dec. 29, 2005

Related U.S. Application Data (60) Provisional application No. 60/640,322, filed on Mar. 10, 2005, provisional application No. 60/694,887, filed on Jun. 28, 2005.

(51) Int. Cl.
    *H01L 29/08* (2006.01)

(52) U.S. Cl. .......... 257/40; 257/E33.001; 257/E25.008; 257/E51.018; 428/690; 428/917; 438/82; 438/99

(58) Field of Classification Search ............ 257/40, 257/E33.001, E25.008, E51.018, E51.001; 313/504, 505; 438/82, 99
See application file for complete search history.

(56) References Cited

U.S. PATENT DOCUMENTS

| | | | |
|---|---|---|---|
| 5,986,401 A | 11/1999 | Thompson et al. | 313/504 |
| 6,114,715 A | 9/2000 | Hamada | 257/72 |
| 6,232,714 B1 | 5/2001 | Shen et al. | 313/506 |
| 6,303,238 B1 | 10/2001 | Thompson et al. | 428/690 |
| 6,307,528 B1 | 10/2001 | Yap | 345/45 |
| 6,411,019 B1 | 6/2002 | Hofstra et al. | 313/112 |
| 6,476,783 B2 | 11/2002 | Matthies et al. | 345/82 |
| 6,518,700 B1 | 2/2003 | Friend et al. | 313/504 |
| 6,608,333 B1 | 8/2003 | Lee et al. | 257/98 |
| 6,670,645 B2 | 12/2003 | Grushin et al. | 257/98 |
| 7,326,460 B2 * | 2/2008 | Hirai | 428/209 |
| 2002/0030193 A1 | 3/2002 | Yamazaki et al. | 257/98 |
| 2002/0039871 A1 | 4/2002 | Hofstra et al. | 445/24 |
| 2002/0043928 A1 | 4/2002 | Cho | 313/505 |
| 2002/0057053 A1 | 5/2002 | Hitoshi | 313/505 |
| 2002/0153834 A1 | 10/2002 | Hofstra et al. | 313/506 |
| 2002/0195932 A1 | 12/2002 | Steckl et al. | 313/509 |
| 2003/0035978 A1 | 2/2003 | Raychaudhuri et al. | 428/690 |
| 2003/0038593 A1 | 2/2003 | Aziz et al. | 313/506 |
| 2003/0184705 A1 * | 10/2003 | Murade et al. | 349/158 |

FOREIGN PATENT DOCUMENTS

| | | | |
|---|---|---|---|
| EP | 0 372 763 B1 | 7/1996 |
| EP | 0 845 925 A1 | 6/1998 |
| EP | 1 160 890 A2 | 12/2001 |
| EP | 1 223 618 A2 | 7/2002 |

(Continued)

OTHER PUBLICATIONS

Krasnov, A.N., "High-Contrast Organic Light-Emitting Diodes on Flexible Substrates", *Applied Physics Letters*, May 2002, 80(20), 3853-3855.

*Primary Examiner*—Hsien-ming Lee
(74) *Attorney, Agent, or Firm*—Woodcock Washburn LLP (57) ABSTRACT

Organic electronic devices that include dummy electrodes are described, along with methods for using such devices.

12 Claims, 5 Drawing Sheets

FOREIGN PATENT DOCUMENTS

| | | |
|---|---|---|
| JP | 10-255978 | 9/1998 |
| WO | WO 98/10621 A1 | 3/1998 |
| WO | WO 00/35028 A1 | 6/2000 |
| WO | WO 00/65670 A1 | 11/2000 |
| WO | WO 00/70655 | 11/2000 |
| WO | WO 01/41512 A1 | 7/2001 |
| WO | WO 03/005776 A1 | 1/2003 |
| WO | WO 03/008424 A1 | 1/2003 |
| WO | WO 03/040257 A1 | 5/2003 |
| WO | WO 03/063555 A1 | 7/2003 |
| WO | WO 03/091688 A2 | 11/2003 |
| WO | WO 2004/016710 A1 | 2/2004 |

\* cited by examiner

ORGANIC ELECTRONIC DEVICE AND PROCESSES FOR FORMING AND USING THE SAME

CROSS REFERENCE

This application claims benefit to U.S. Provisional Application Ser. Nos. 60/640,322 filed Mar. 10, 2005 and 60/694,887 filed Jun. 28, 2005, the disclosures of which are each incorporated herein by reference in their entireties.

FIELD

This disclosure relates generally to organic electronic devices, and materials and methods for fabrication of the same.

BACKGROUND

Organic electronic devices convert electrical energy into radiation, detect signals through electronic processes, convert radiation into electrical energy, or include one or more organic semiconductor layers. Most organic electronic devices comprise electrodes.

Thus, what is needed are methods of making organic electronic devices comprising electrodes.

SUMMARY

The present disclosure describes organic electronic devices that have at least one structure denominated a "dummy electrode" adjacent to at least one pair of active electrodes of the same polarity. The term "adjacent" refers to the spatial relationship of the dummy electrode relative to the pair of active electrodes. In the context of this disclosure, the spatial relationship is a distance between the dummy electrode and one of the pair of active electrodes where an electric potential difference exists between the dummy electrode and one of the pair of active electrodes. In some embodiments, the organic electronic device also includes a getter layer.

In addition, the present disclosure describes organic electronic devices that include a plurality of dummy electrodes and a plurality of active electrodes of the same polarity, in which the dummy electrodes and the plurality of active electrodes are substantially interdigitated with respect to each other.

Also described herein are diverse processes for using the present organic electronic devices. The organic electronic devices include a first active electrode, which can include a selected first active electrode and an unselected first active electrode. In some embodiments, the processes include biasing the selected first active electrode to a first selected potential, V1, and biasing the unselected first active electrodes to a first unselected potential, V2, which is different from V1. Additionally, the dummy electrodes are biased to a dummy potential, Vd, so that when V2<V1, then Vd≦V2. Alternatively, when V2>V1, then Vd≦V1.

Other features and advantages of the foregoing embodiments will be apparent from the following detailed description, including the drawings, and from the claims. The foregoing general description and the following detailed description are exemplary and are not restrictive of the invention, as defined in the appended claims.

BRIEF DESCRIPTION OF THE DRAWINGS

The invention is illustrated by way of example and is not limited by the accompanying figures. The figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The present disclosure provides organic electronic devices that incorporate dummy electrodes in addition to the common active electrodes, an anode and cathode. During operation of the organic electronic device, the dummy electrode can be biased to attract mobile ions, thereby keeping the ions away from near the anodes, cathodes, or both. In addition, a mobile ion gettering material can also be incorporated into the organic electronic device. The gettering material can getter or trap mobile ions, which reduces the likelihood of the mobile ions migrating throughout the device. By keeping the mobile ions away from the anodes or cathodes, charged mobile ions are less likely to accumulate near active electrodes, such as the anodes or cathodes, which can interfere with the regular operation of the organic electronic device. In some embodiments, the organic electronic devices include dummy electrodes that work to prevent the migration of mobile cations from gathering near the anodes.

The operation of organic electronic devices, such as passive matrix organic light-emitting diode ("OLED") displays, depends on the formation of a voltage potential between an anode and cathode. The anode and cathode will have one or more conductive, semi-conductive, or insulating layers in between. In some cases, the devices can have a voltage potential between adjacent anodes, such as anodes of adjacent pixels, when the adjacent anodes are in opposite potential states, e.g., when one is selected and one is unselected. For example, a selected anode, e.g., an anode of a selected pixel, may be held at +3 V while the unselected anode is at −9 V, e.g., an anode of an unselected pixel. This generates a potential difference between the selected and unselected anodes, which can cause mobile ions to migrate through a conductive buffer material towards the unselected anode. This can result in capture-current flow of positively charged mobile ions (cations) toward the more negatively charged anode (unselected anode). Examples of the cations include elements of Group 1 or Group 2, including $Na^+$, $K^+$, or $Ca^+$. The distribution and flux of cations reflects the local electrical field. When the formerly unselected pixel is selected or illuminated (i.e., the voltage is in the more positive state), the anode of the formerly unselected pixel is initially in a "charged" state with an excess of accumulated cations near that anode. This can render such anode, which is now in a more positively charged state, less effective at injecting holes in regions where ions have accumulated. The visual effect that can result is the anode regions with excess ion accumulation having a darker appearance. The vernacular for this defect is "wide column gap" since the unselected "column" (anode) spacing between adjacent pixels appears wider than normal.

If the formerly selected pixel is turned to the unselected or unlit state, the potential between the pixels is reversed, and the cations are driven in the reverse direction. After enough time, the distribution is at a level that no visible defect is observed. However, after still more time, the visible defect is reproduced with excess cations now built up on the anode of the currently unselected pixel. The alternate switching of adjacent anodes from selected to unselected can be switched more rapidly to prevent unwanted cation accumulation near the unselected anode. In some embodiments, the effective switching speeds of active electrodes can be reduced to allow better real-time image display or detection.

DEFINITIONS

As used herein, the term "active electrode" means an electrode, whose absence would render at least one electronic component within a device to be inoperable or permanently disconnected. For an organic electronic device, the active electrodes can include anodes and cathodes. Other active electrodes can include terminals that are part of transistors, capacitors, resistors, inductors, diodes, and power supplies that are part of the array, peripheral, or remote circuitry used to properly operate the organic electronic device.

The term "adjacent" refers to a nearby spatial relationship between two or more elements. As between the dummy electrode and the pair of active electrodes of the same polarity, "adjacent" is a distance that is close enough that an electric potential difference exists between the dummy electrode and one of the pair of active electrodes.

The terms "array," "peripheral circuitry" and "remote circuitry" are intended to mean different areas or components of the organic electronic device. For example, an array may include a number of pixels, cells, or other structures within an orderly arrangement (usually designated by columns and rows). The pixels, cells, or other structures within the array may be controlled locally by peripheral circuitry, which may lie within the same organic electronic device as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "dummy electrode" means an electrode other than an active electrode. A dummy electrode, while serving a beneficial purpose, is not one of the active electrodes that form the opposing electrodes of the main circuitry of the organic electronic device, e.g., a cathode or anode.

The term "getter" means a substance that adsorbs contaminant gases that cause damage to organic layers in electronic devices. The getter materials may also absorb water. In one embodiment, the getter comprises a material selected from molecular sieves, clays, natural zeolites, and synthetic zeolites. A "getter layer" is formed from getter material.

The term "electron withdrawing" is synonymous with "hole injecting." Literally, holes represent a lack of electrons and are typically formed by removing electrons, thereby creating an illusion that positive charge carriers, called holes, are being created or injected. The holes migrate by a shift of electrons, so that an area with a lack of electrons is filled with electrons from an adjacent layer, which give the appearance that the holes are moving to that adjacent area. For simplicity, the terms holes, hole injecting, hole transport, and their variants will be used.

The term "buffer layer" as used herein is intended to mean an electrically conductive or semiconductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device. Although not wholly overlapping, the buffer layer generally refers to a charge transport layer.

The term "elevation" means a distance from a plane defined by a primary surface of a substrate.

The term "low work function material" is intended to mean a material having a work function no greater than about 4.4 eV. The term "high work function material" is intended to mean a material having a work function of at least approximately 4.4 eV.

The term "parasitic component" means an undesired electronic component that results from the placement of conductors or other features near each other within the electronic component. For example, a parasitic capacitor is formed by two active electrodes, both of which may be cathodes, and an insulating material between them. Although parasitic components are undesired, they will almost always be present, at least to a limited extent, in nearly every electronic device.

The term "primary surface" refers to a surface of a substrate from which electronic components are fabricated.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control.

In addition, the materials, methods, and examples are illustrative only and not intended to be limiting.

The present disclosure describes organic electronic devices that have at least one dummy electrode adjacent to at least one pair of active electrodes of the same polarity. The term adjacent refers to the spatial relationship of the dummy electrode and the at least one pair of active electrodes, which is a distance apart in which the dummy electrode and one of the pair of active electrodes generates an electric potential difference. In some embodiments, the dummy electrodes are biased so that an electric potential difference exists between the dummy electrode and a selected one of the pair of active electrodes. This electric potential difference is equal to or greater than that formed between the pair of active electrodes, where one is selected and one is unselected. The electric potential difference between the dummy electrode and the one of the pair of active electrodes is great enough to draw mobile ions in a nearby buffer layer from near the pair of active electrodes. In many of the organic electronic devices, the pair of active electrodes are anodes and the mobile ions are cations. Additionally, the active electrodes and dummy electrodes may be formed of similar materials and have substantially the same composition.

In many organic electronic devices, e.g., OLEDs, an anode is deposited onto a substrate, and after one or more layers are deposited over the anode, a cathode is deposited. The anode and its corresponding cathode can define a pixel, and together they can generate an electric potential difference when they are selected. In some cases, the active electrodes have the form of a dot, or other single geometric shape, strip, or continuous layer (a plane). In instances where the active electrodes are dots or strips, the dummy electrodes can be deposited nearby. In some cases, the dummy electrodes can be deposited in between the active electrodes that are dots or strips, giving an alternating pattern, or a substantially interdigitated pattern. In alternative embodiments, the dummy electrode can be a conductive layer that is deposited adjacent to a layer containing the active electrodes. For example, in one embodiment, a conductive layer is deposited onto a substrate, thereby forming a dummy electrode layer. Onto this dummy electrode layer, an active electrode layer can be deposited.

In some embodiments, the organic electronic device also includes a getter layer. In some examples, a layer of insulating material, such as phosphorus-doped glass, is deposited over the layer of dummy electrodes. The layer of active electrodes can then be deposited onto the getter layer.

In some embodiments, organic electronic devices can include a plurality of dummy electrodes and a plurality of active electrodes of the same polarity, where the dummy electrodes and the plurality of active electrodes are substantially interdigitated with respect to each other.

The present organic electronic devices operate in a number of ways. In some embodiments, a selected first active electrode is biased to a first selected potential, V1, and an unselected first active electrode is biased to a first unselected potential, V2. The two potentials, V1 and V2 are different and likely create an electric field. Further, the device includes a dummy electrode that is biased to a dummy potential, Vd. When one of the first active electrodes is selected and biased, then V2<V1 and Vd≦V2, or alternatively V2>V1 and Vd≦V1. In embodiments where the first active electrode is an anode, when the selected anode is biased, V2<V1 and Vd≦V2. In contrast, when the first active electrode is a cathode, V2>V1 and Vd≦V1 when the selected cathode is biased. The foregoing relationships of the different electric potentials represent that the electric potential difference between the biased dummy electrode and the biased selected first active electrode is equal to or greater than the electric potential difference between the biased selected first active electrode and the biased unselected first active electrode.

The present organic electronic devices can have another active electrode, or second active electrode, thereby having the three different electrodes present: the dummy electrodes, first active electrodes, and second active electrodes. The active electrodes are necessary for the operation of the device and are either first being anode and second being cathode, or the opposite, first being cathode and second being anode. The second active electrodes are comprised of a selected second active electrode and unselected second active electrodes, where the selected second active electrode and the selected first active electrode generate an electric potential difference between them. In addition, the unselected second active electrode and unselected first active electrode generates a substantially zero electric potential difference.

In some embodiments, the second active electrode is a single active electrode, which in some instances is a cathode. The single active electrode is a continuous conductive layer, generally planar in structure, that functions as one of the active electrodes.

Attention is now directed to details for a first set of embodiments that is described and shown in FIGS. 1-5 in which a conductive member can act as a dummy electrode. The dummy electrode can lie along opposite sides of active electrodes, and more particularly, anodes. The embodiments described with respect to FIGS. 1-5 can be achieved by changing the layout of the device. In many cases, there is no need for the addition of new layers or processing steps to form the present devices. In situations where such addition is avoided, there can be some significant efficiencies as process development and integration concerns with new materials are reduced, or even eliminated.

The embodiments as illustrated in FIGS. 1-5 can be used for making, for example, a monochromatic passive matrix OLED display. Modifications for use with multi-color or full-color passive matrix and active matrix OLED displays are also described herein.

Figure 1:
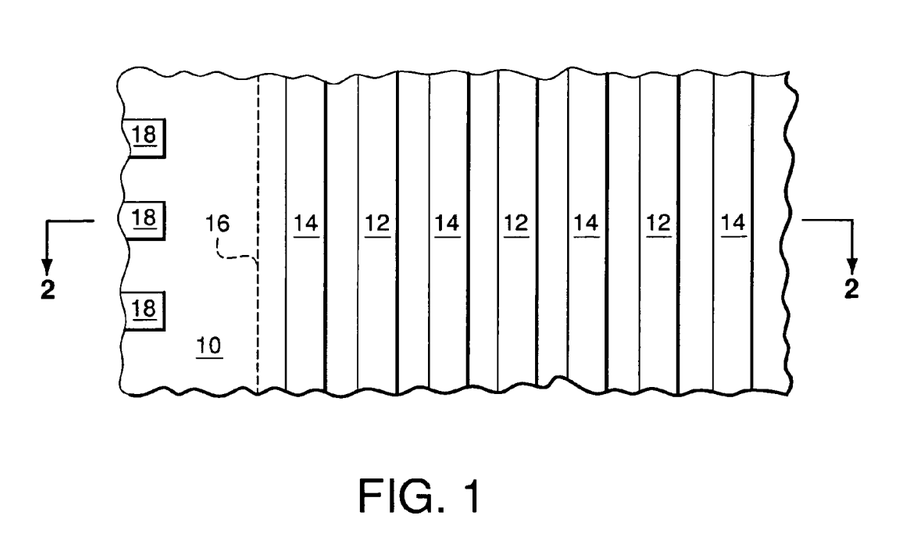
FIG. 1 is a plan view of a portion of a substrate after forming first conductive members.

FIG. 1 is a plan view of a portion of a substrate 10. FIG. 1 includes a portion of an array of an OLED. Arrays are typically much larger, but a smaller array is described to better and more practically describe the present devices. The substrate 10 can include nearly any type and number of materials including conductive, semiconductive, or insulating materials. If substrate 10 includes a conductive base material, care may need to be exercised to ensure the proper electrical isolation between parts of a component. The conductive base material may be covered by an insulating layer having a sufficient thickness to reduce the effects of parasitic capacitance between overlying electrodes or conductors and the underlying conductive base material.

The substrate 10 may comprise a ceramic material (e.g., glass, alumina, or sapphire) or a flexible substrate comprising at least one polymeric film. Examples of suitable polymers for the polymeric film may be selected from one or more materials containing essentially polyolefins (e.g., polyethylene or polypropylene); polyesters (e.g., polyethylene terephthalate or polyethylene naphthalate); polyimides; polyamides; polyacrylonitriles and polymethacrylonitriles; perfluorinated and partially fluorinated polymers (e.g., polytetrafluoroethylene, copolymers of tetrafluoroethylene and polystyrenes); polycarbonates; polyvinyl chlorides; polyurethanes; polyacrylic resins, including homopolymers and copolymers of esters of acrylic or methacrylic acids; epoxy resins; Novolac resins; and any combination thereof. When multiple films are used, they can be joined together with appropriate adhesives or by conventional layer production processes including known coating, co-extrusion, or other similar processes. The polymeric films generally have a thickness in the range of approximately 12 microns to 250 microns. When more than one film layer is present, the individual thicknesses can be much less.

Although the polymeric film(s) may contain essentially one or more of the polymers described above, the film(s) can also include one or more conventional additive(s). For example, many commercially available polymeric films contain slip agents or matte agents to prevent the layers of film from sticking together when stored as a large roll.

If the substrate 10 includes a polymeric film, a barrier layer (not shown) may be formed over the substrate 10. The barrier layer can include electrical insulators having an etch rate different from the organic layer that will be subsequently formed and dry etched. The barrier layer can be used as an etch stop and to protect the underlying substrate. Exemplary materials can include $SiO_2$, $Si_3N_4$, insulating metal oxides or nitrides (e.g., $TiO_2$, $Al_2O_3$, $Al_2O_3SiO_2$, $3Al_2O_3SiO_2$, AlN), or combinations thereof, and have a thickness in a range of approximately 2 nm to 500 nm.

The layer can be formed using plasma enhanced chemical vapor deposition or physical vapor deposition (conventional Radio-Frequency (RF) magnetron sputtering or inductively-coupled plasma physical vapor deposition (IMP-PVD)). If the barrier layer is not sufficiently transparent to the radiation to be emitted from or received by the organic electronic device, the barrier layer may be patterned to allow openings at an area where radiation is to pass (e.g., the pixel area for the pixel array).

A number of material(s) are known to be useful for forming the substrate 10, and any one of such material(s) can be used to form such substrate. In each particular embodiment, the appropriate material(s) can readily be chosen based on the physical, chemical, and electrical properties.

Conductive members 12, 14, and 18 may then be formed over the substrate 10 as shown in FIG. 1. The conductive members 12, 14, and 18 can include most conductive material known to be useful for such purposes in the OLED fabrication arts. In this specific embodiment, the conductive members 12 are active electrodes and act as anodes for the organic electronic device ultimately formed. The dashed line 16 represents the border of the array. To the right of the dashed line in FIG. 1 is the array, and to the left is outside the array.

The material of the conductive members 12, 14, and 18 at the surface closest to the subsequently formed organic active layer will have a work function relatively higher than subsequently formed conductive members that act as the cathodes. A plurality of conductive layers may be formed to create the conductive members 12, 14, and 18. In this particular embodiment, the conductive members 12 lie between the user side of the organic electronic device and the subsequently formed organic active layer. Conductive members 12 can be designed so that at least 70% of the radiation emitted from or received by the array passes through the conductive members 12. Exemplary materials include ITO, zirconium tin oxide ("ZTO"), elemental metals, metal alloys, and combinations thereof. ITO and ZTO may be thicker when used as the conductive members 12, but they still allow sufficient transmission of radiation. For example, when ITO or ZTO are used as the conductive members 12, 14, and 18, the conductive members 12, 14, and 18 may have a thickness in a range of approximately 100 nm to 200 nm. The conductive members 12 are formed using a conventional technique, such as those in the OLED fabrication arts.

Although not shown, a layer of electrical insulating material may be formed over the substrate between the conductive members 12, 14, and 18. This material can help to electrically isolate conductive members 12, 14, and 18, improve planarity of subsequently formed layers, or potentially serve other purposes. The material may be organic or inorganic.

Figure 2:
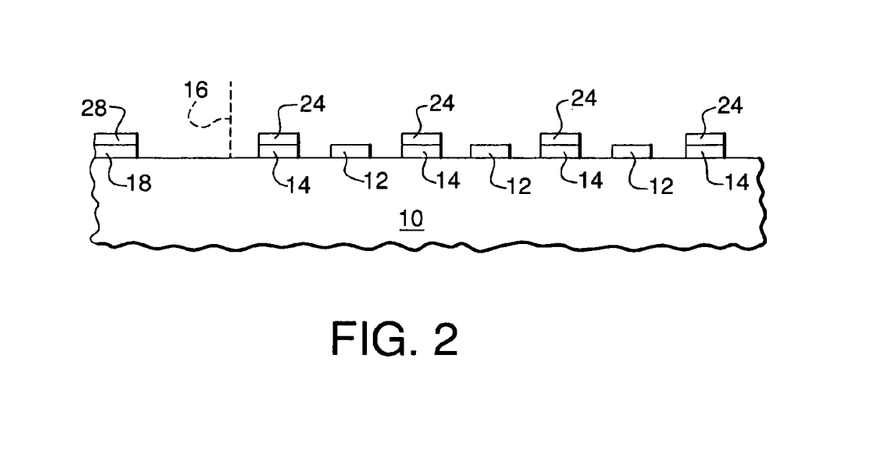
FIG. 2 is a cross-sectional view of the substrate of FIG. 1 at sectioning lines 2-2 after forming second conductive members.

A patterned second conductive layer is used to form conductive members 24 and 28 as shown in FIG. 2. The combinations of conductive members 14 and 24 act as the dummy electrodes, and the combinations of conductive members 18 and 28 act as the conductive leads that provide electrical connections between subsequently formed conductive members that are active electrodes and act as the cathodes within the array. The conductive members 24 and 28 may be formed using a conventional technique and may comprise one or more layers of Cr, Al, Mo, Cu, Ti, Ta, conductive nitrides, a noble metal (Pt, Pd, or Au), a metal capable of forming a conductive oxide (Ru, Rh, Ir, and Os) or a mixture thereof. In one embodiment, the conductive members 24 and 28 may comprise a plurality of layers including an adhesion layer, a low-resistivity conducting layer, and a protective capping layer. The plurality of layers may be Cr/Al/Cr, Cr/Cu/Cr, or Mo/Cu/Mo. Note that the order in which the first level conductive members 12, 14, and 18 and the second level conductive members 24 and 28 are formed may be reversed in some embodiments.

A cathode-separation layer (not shown) may be formed by liquid depositing or vapor depositing an insulating layer to a thickness of approximately 2 µm to 5 µm and patterning the layer to form mushroom shaped structures. Within the array, the cathode-separation layer covers the entire array except where cathodes are subsequently formed. Within the openings, portions of the substrate 10, conductive members 12, 24, and 28 are exposed. The peripheral and remote circuitry areas away from the portions of the conductive members 18 and 28 as shown in FIGS. 1 and 2 are exposed and are not covered by the cathode-separation layer. The cathode-separation layer may comprise a photoimageable material including photoresist or polyimide. In one embodiment, a Novolac positive photoimageable resist with image reversal capability may be used.

Figure 3:
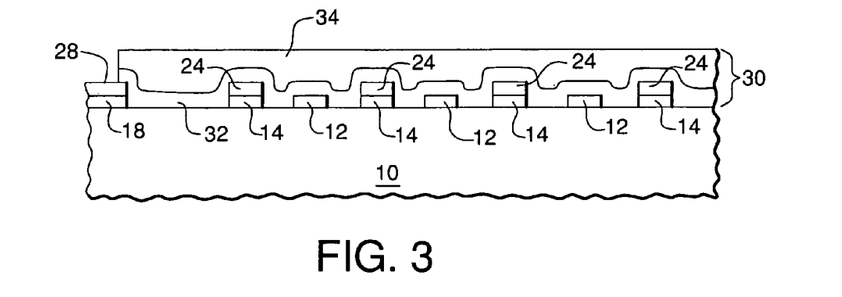
FIG. 3 is a cross-sectional view of a portion of the substrate of FIG. 2 after forming a hole-transport layer and an organic active layer.

An organic layer 30 may be formed as shown in FIG. 3. The organic layer 30 may include one or more layers. For example, the organic layer 30 may include a buffer layer 32 and an organic active layer 34, or the organic layer 34 without the buffer layer 32. Note that buffer layer 32 may overlie or underlie and overlie the organic active layer 34. When the buffer layer 32 lies between the conductive members 12 and the organic active layer 34, the buffer layer 32 will be a hole-transport layer, and when the buffer layer 32 lies between the organic active layer 34 and subsequently formed conductive members 12 that act as cathodes, the buffer layer will be an electron-transport layer. In another embodiment, buffer layers may lie on both sides of the organic active layer 34. The embodiment as shown in FIG. 3 shows a buffer layer 32 that acts as the hole-transport layer.

The buffer layer 32 and the organic active layer 34 are formed sequentially over the conductive members 12, 24, and 28. Each of the buffer layer 32 and the organic active layer 34 can be formed by spin coating, casting, or vapor depositing appropriate materials as described below. One or both of the buffer layer 32 and the organic active layer 34 may be cured after it is applied. The organic layer 30 overlies the tops of the cathode-separation layer and along the bottoms of openings within the cathode-separation layer.

In this embodiment, the buffer layer 32 is a hole-transport layer. The hole-transport layer can be used to reduce the amount of damage and potentially increase the lifetime and reliability of the device compared to a device where the conductive members 12 would directly contact the organic active layer 34. The hole-transport layer typically is conductive to allow electrons to be removed from the subsequently formed active region and transferred to the conductive members 12. Although the conductive members 12 and the optional hole-transport layer are conductive, typically the conductivity of the conductive members 12 is significantly greater than the hole-transport layer. Both hole transporting small molecules and polymers can be used. In one specific embodiment, the hole-transport layer can be, but is not limited to: N,N'-diphenyl-N,N'-bis(3-methylphenyl)-[1,1'-biphenyl]-4,4'-diamine (TPD), 1,1-bis[(di-4-tolylamino) phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-d iethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine(TTB), N,N'-Bis(naphthalen-1-yl)-N,N'-bis-(phenyl)benzidine (α-NPB) and porphyrinic compounds, such as copper phthalocyanine. Commonly used hole transporting polymers include, but are not limited to, polyvinylcarbazole, (phenylmethyl)polysilane, poly(dioxythiophenes), and polyaniline. Some hole transporting polymers are generated by doping hole transporting molecules such as those mentioned above into polymers such as polystyrene and polycarbonate. The hole-transport layer can have a thickness in a range of approximately 100 nm to 250 nm.

The composition of the organic active layer 34 typically depends upon the application of the organic electronic device. When the organic active layer 34 is used in a radiation-emitting organic electronic device, the material(s) of the organic active layer 34 will emit radiation when sufficient bias voltage is applied across the organic active layer 34. The radiation-emitting active layer may contain nearly any organic electroluminescent or other organic radiation-emitting materials known to be available in the OLED fabrication arts. The organic active layer 34 typically has a thickness in a range of approximately 50 nm to 500 nm.

Any organic electroluminescent ("EL") material can be used in organic active layer 34, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

Although not shown, an optional electron-transport layer may be formed over the organic active layer 34. The electron-transport layer is another example of a buffer layer. The electron-transport layer typically is conductive to allow electrons to be injected from the subsequently formed cathode and transferred to the organic active layer 34. Although the subsequently formed cathode and the optional electron-transport layer are both conductive, typically the conductivity of the cathode is significantly greater than the electron-transport layer.

In one embodiment, the electron-transport layer can include metal chelated oxinoid compounds, such as bis(2-methyl-8-quinolinolato)(para-phenyl-phenolato)aluminum (III) (BAIQ) and tris(8-hydroxyquinolato)aluminum ($Alq_3$); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and mixtures thereof. Alternatively, the optional electron-transport layer may be inorganic and comprise BaO, LiF, or $Li_2O$. The electron-transport layer typically has a thickness of approximately 30 nm to 500 nm.

The portions of organic layer 30 overlying peripheral and remote circuitry areas can be removed by laser ablation or another conventional technique. The patterning of the organic layer exposes portions of the conductive members 28 (for cathodes) to allow subsequently formed conductive members to make electrical contact to the conductive members 28.

Figure 4:
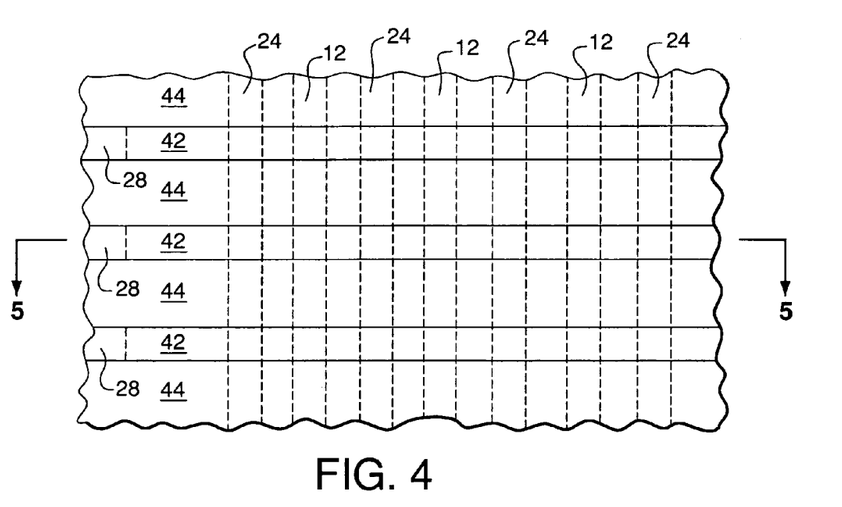
FIG. 4 is a plan view of a portion of the substrate of FIG. 3 after forming third conductive members.

A patterned third conductive layer, including conductive members 42 and 44, may be formed as shown in FIG. 4. Conductive members 42 act as cathodes and overlie the organic layer 30 and conductive members 12, 24, and 28. The dashed lines in FIG. 4 illustrate some of the underlying conductive members to better illustrate positional relationships.

The patterned third conductive layer may be formed over the organic layer 30 using physical vapor deposition (e.g., evaporation, sputtering). Conductive members 44 overlie the cathode-separation layer, while conductive members 42 do not. Due to the directional nature of the physical vapor deposition and the shape of the structures within the cathode-separation layer, each of conductive members 42 are not electrically connected to one another or the conductive members 44. If the walls of the cathode-separation layer become closer to vertical, an optional collimator may be used during deposition to reduce the likelihood of an unintended electrical short or leakage path between any of the conductive members 42 and 44.

Figure 5:
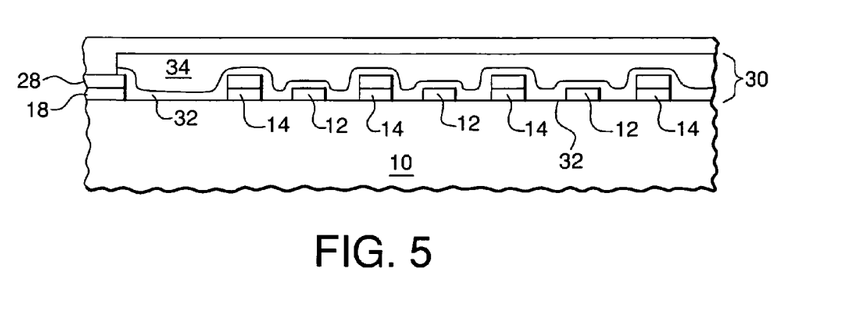
FIG. 5 is a cross-sectional view of the substrate of FIG. 4 at sectioning lines 5-5 after forming the third conductive members.

FIG. 5 includes a cross sectional view through one of the conductive members 42 as illustrated by sectioning line 5-5 in FIG. 4. Although not shown, another pair of conductive members similar to conductive members 18 and 28 may lie near the opposite side of the array and be electrically connected to conductive member 42.

In general, the patterned third conductive layer including the conductive members 42 and 44 can comprise a metal-containing layer having a low work function, which is lower than the conductive members 12,14, and 18, which have a high work function. The conductive members 42 and 44 have different composition compared to the conductive members 12, 14, and 18. Materials for the conductive members 42 and 44 can be selected from Group 1 metals (e.g., Li, Cs), the Group 2 (alkaline earth) metals, the rare earth metals including the lanthanides and the actinides. Each of the conductive members 42 and 44 has a thickness in a range of approximately 300 nm to 600 nm. In one embodiment, a Ba layer of less than approximately 10 nm followed by an Al layer of approximately 500 nm can be deposited. The Al layer may be replaced by or used in conjunction with any of the metals and metal alloys described with respect to the conductive members 24 and 28.

The three types of electrodes discussed herein can be seen in a portion of an array as illustrated in FIG. 4. Conductive members 12 are anodes, conductive members 42 are cathodes, and pairs of conductive members 14 and 24 are dummy electrodes. Conventional organic electronic devices generally have two types of electrodes within the array: anodes and cathodes. These also represent the two types of active electrodes, which can generate a potential difference between one another and form an electrical current. Other circuitry not illustrated in FIGS. 1-5 may be formed using any number of the previously described or additional layers. Although not shown, additional insulating layer(s) and interconnect level(s) can be formed to allow for circuitry in peripheral areas (not shown) that may lie outside the array. Such circuitry may include row or column decoders, strobes (e.g., row array strobe, column array strobe), or sense amplifiers. An encapsulating layer (not shown) can be formed over the array and the peripheral and remote circuitry to form a substantially completed electrical component, such as an electronic display, a radiation detector, and a voltaic cell. The encapsulating layer may be attached such that no organic layers lie between it and the substrate 10. Radiation may be transmitted through the encapsulating layer, in which case the encapsulating layer is substantially transparent to the radiation.

Many alternatives exist for structures and layout of the dummy electrodes. Referring to FIG. 2, only one of the conductive members 14 or 24 can be used for the dummy electrodes. If the conductive members 24 are not used, the conductive members 12 and 14 may be nearly identical. They can be formed using the same layer(s) during the same processing steps and lie at substantially the same elevation. In some embodiments, the conductive members 12, 14, and 18 can have substantially the same composition. Alternatively, conductive members 14 and 18 may not be used. In this embodiment, the conductive members 12, 24, and 28 would lie at substantially the same elevation. In some embodiments, the conductive members 24 and 28 have substantially the same composition. In such embodiments, the conductive members 12 may be formed from different layer(s) compared to the conductive members 24 and 28. In still further embodiments, another conductive member formed from yet other layer(s) may be used in conjunction with or replace either or both of the conductive members 24 and 28.

Referring to FIG. 4, the conductive members 12 and pairs of conductive members 14 and 24 are substantially interdigitated with respect to each other. In an alternative embodiment, every other pair of conductive members 14 and 24 could be removed. Even fewer can be used in still a further embodiment; however, the ability to attract mobile ions may be reduced.

In a further embodiment, a black lattice, black layer, or both may be used in conjunction with or as part of the conductive members 24 or 28. The black lattice or black layer helps to improve contrast by reducing ambient radiation (e.g., ambient light) that may be reflected by the organic electronic device. Further details and concepts can be found in U.S. patent application Ser. No. 10/840,807 filed May 7, 2004, and U.S. Ser. No. 10/658,236 filed Sep. 8, 2003.

Figure 6:
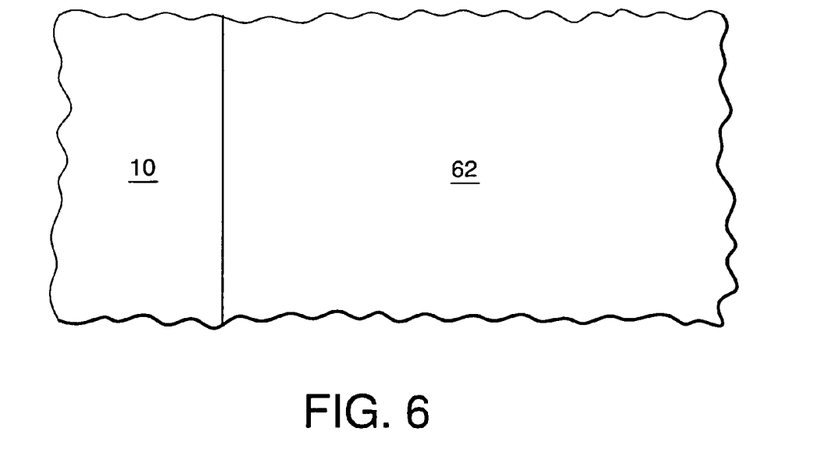
FIG. 6 is a plan view of a portion of a substrate after forming a first conductive plane.
Figure 7:
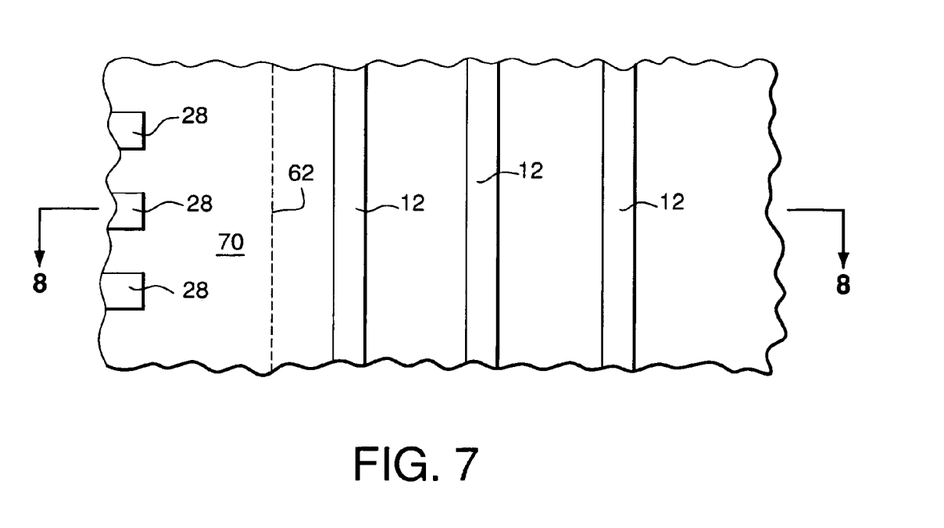
FIG. 7 is a plan view of the substrate of FIG. 6 after forming first conductive members.
Figure 8:
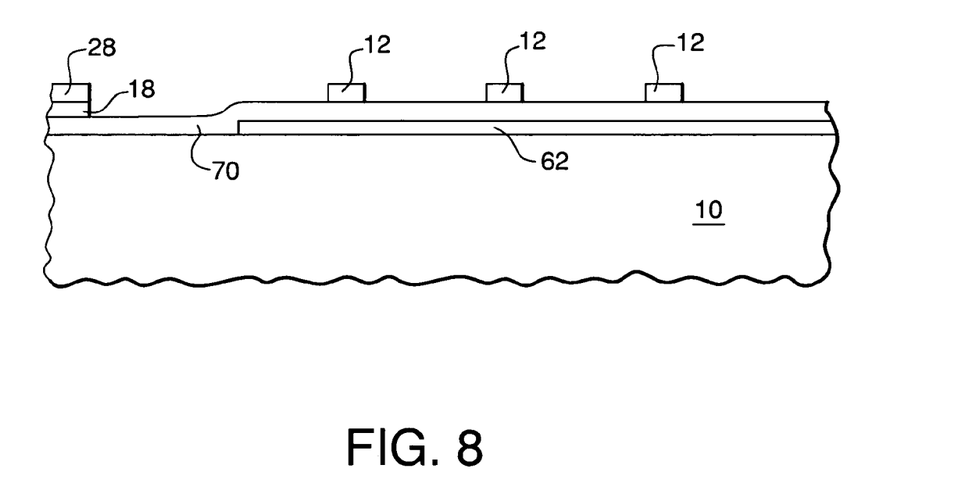
FIG. 8 is a cross-sectional view of the substrate of FIG. 7 at sectioning lines 8-8 after forming second conductive members.

FIGS. 6-8 illustrate further embodiments. A conductive member can be used as a conductive plane to attract mobile ions. As in FIG. 6, a conductive member 62 may be formed over the substrate 10. The conductive member 62 may be formed using any of the material(s) and process(es) previously described with respect to conductive members 12, 14, 18, 24, and 28. The conductive member can comprise one or more layers, although only one is illustrated in FIGS. 6-8 for simplicity.

The conductive member 62 occupies an area corresponding to substantially all of the array and is substantially the same size as the array. In alternative embodiments, a smaller or larger area of the substrate may be covered. The conductive member 62 should be designed such that at least 70% of the radiation to be emitted from or received by the array passes through the conductive member 62 similar to conductive member 12. The actual materials used and thicknesses of those materials within the conductive member 62 may be limited in order to have sufficient transmission.

An electrically insulating layer 70 is formed over the conductive member 62 as shown in FIGS. 7 and 8. The electrically insulating layer 70 should allow at least 70% of the radiation emitted from or received by the array to pass through the electrically insulating layer 70. Also, the electrically insulating layer 70 should allow mobile ions to migrate through the layer or to be gettered by it. Mobile ions can migrate through undoped glass (silicon dioxide) and may be gettered by a phosphorus-doped glass ("PSG"). If PSG, which is a mobile ion gettering material, is used and undesired interactions with conductive member 62 or subsequently formed members 12 and 18 are to be avoided, the insulating layer 70 may include an undoped glass/PSG/undoped glass sandwich. In addition to silicon dioxide, the electrically insulating layer can include other known inactive materials. In addition to PSG, arsenic-doped glass can also be used as a mobile ion gettering material.

The electrically insulating layer 70 may be formed by liquid deposition or vapor deposition (physical or chemical). An optional curing step may be performed. If no organic materials are present (substrate 10 does not include a polymer layer), the curing step can be performed at 500° C. and potentially higher. The processing steps of depositing and curing can be performed using conventional techniques. The thickness of the electrically insulating layer 70 may be in a range of approximately 10 nm to 1000 nm. Below 10 nm, capacitive coupling between conductive members 62 and 12 may be too high, and potentially may allow electrons to tunnel through the electrically insulating layer 70. While no known upper limit exists for the electrically insulating layer 70, the ability of the conductive member 62 to attract mobile ions away from the conductive members 12 may be significantly reduced. Also, a very thick electrically insulating layer 70 may result in elevational differences between the array and peripheral and remote circuitry areas that can cause processing complications at other steps or make the overall thickness of the organic electronic device too large. In other embodiments, the electrically insulating layer 70 may be thinner or thicker than described.

Conductive members 12, 18, and 28 may be formed as previously described to give the structures and layouts as seen in FIGS. 7 and 8. The rest of the processing of the organic electronic device is substantially the same as previously described. This embodiment allows the conductive members 12 to be more closely spaced compared to the prior embodiment where pairs of conductive members 14 and 24 are formed. Therefore, a compact array can be achieved and still obtain benefits of reducing the adverse effects of mobile ions near conductive members 12.

Although much of the description has been more focused on passive matrix displays, the principles can be applied to active matrix displays. Instead of having columns of conductive members 12 as shown in FIGS. 1-5, 7 and 8, each pixel may have its own discrete, generally rectangular shaped conductive member as an anode. The pairs of conductive members 14 and 24 may be oriented between columns of the anodes (similar to FIGS. 1-5), between rows of anodes, or in the form of a lattice, where anodes lie within openings of the lattice.

In still other embodiments, the orientation of the layers may be reversed. In other words, conductive members 42 would be closer to the substrate 10 compared to the conductive members 12. The conductive members 12, 14, 18, 24, and 28 would be formed after the organic layer 30 is formed. If the conductive member 62 would be formed with such reverse orientation and lies further from a user side of the organic electronic device compared to the organic layer 30, the conductive member 62 does not need to be transparent to the radiation emitted from or received from the device.

Figure 9:
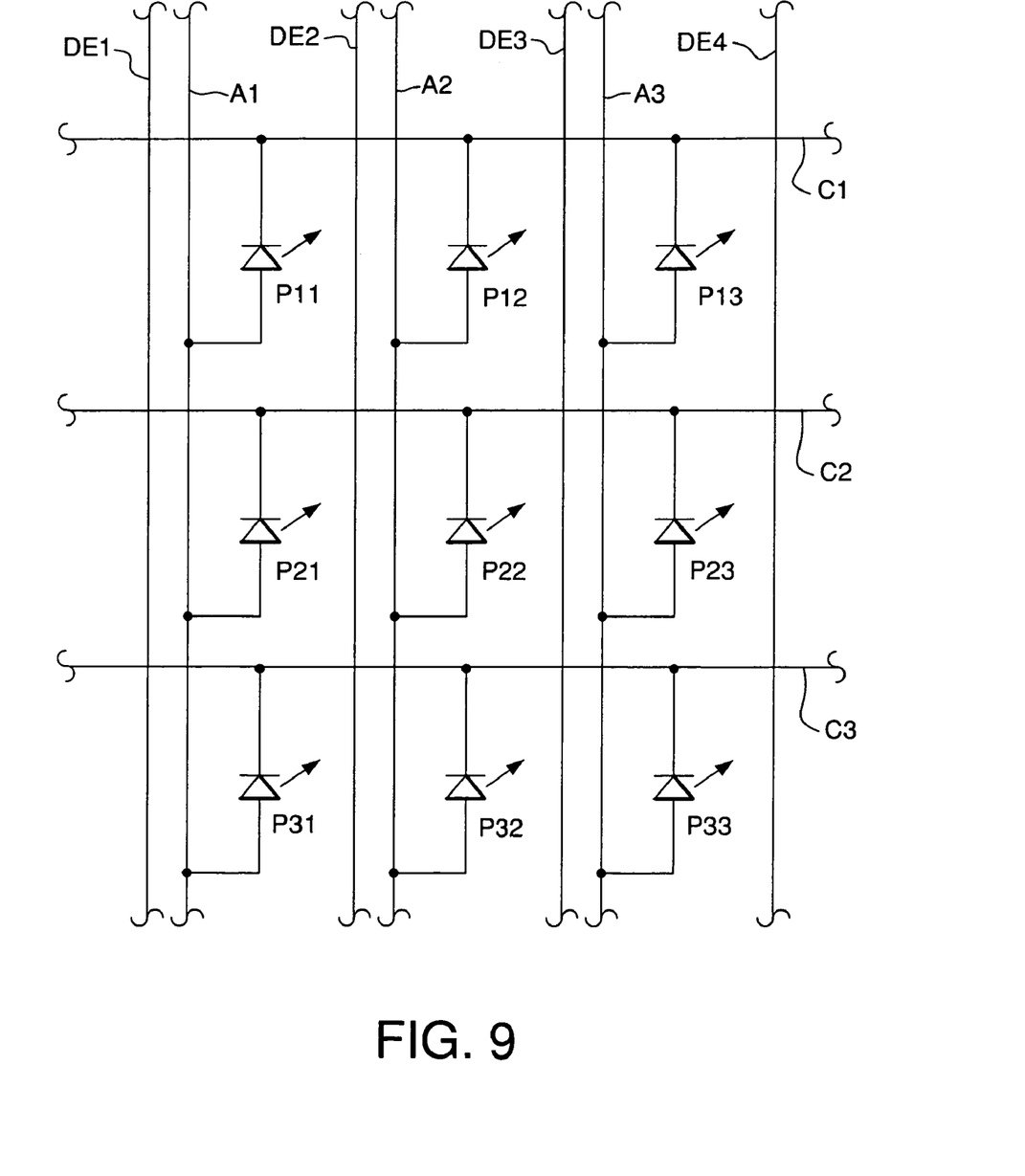
FIG. 9 includes a circuit schematic for the portion of the array as shown in FIG. 4.

In one embodiment, an organic electronic device includes an array. A portion of this array is illustrated in FIG. 4, which can be used in a display. FIG. 9 includes a circuit schematic of the portion of the array that is shown in FIG. 4. Referring to FIGS. 4 and 9, the conductive members 12 correspond to the anodes (A1, A2, and A3), the conductive members 42 correspond to the cathodes (C1, C2, and C3), and the conductive members 24 correspond to the dummy electrodes (DE1, DE2, DE3, and DE4). FIG. 4 includes nine pixels that correspond to intersections of conductive members 12 and 42. The pixels are seen in FIG. 9 as OLEDs designated at P11, P12, P13, P21, P22, P23, P31, P32, and P33. The pixels are designated by row and column. P11 corresponds to the pixel closest to the top, left-hand corner in FIG. 4, and P33 corresponds to the pixel closest to the bottom, right-hand corner in FIG. 4.

Table 1 includes an exemplary set of potentials that may be used for operation P11, P22, and P33 (selected pixels).

TABLE 1

|  | P11 | P22 | P33 |
|---|---|---|---|
| DE1 | −10 | −10 | −10 |
| A1 | +3 | −9 | −9 |
| DE2 | −10 | −10 | −10 |
| A2 | −9 | +3 | −9 |
| DE3 | −10 | −10 | −10 |
| A3 | −9 | −9 | +3 |
| DE4 | −10 | −10 | −10 |
| C1 | −9 | * | * |
| C2 | * | −9 | * |
| C3 | * | * | −9 |

* = electrically floating

In this specific example, the organic electronic device is designed so that a 12 V difference between an anode and cathode causes light or other radiation to be emitted from the display. For P11, A1 and C1 are the selected active electrodes, and A2, A3, C2, and C3 are the unselected active electrodes. For P22, A2 and C2 are the selected active electrodes, and A1, A3, C1, and C3 are the unselected active electrodes. For P33, A3 and C3 are the selected active electrodes, and A1, A2, C1, and C2 are the unselected active electrodes. When a pixel is selected, the potential difference between the selected active electrodes is +3 V−(−9 V) or +12 V. For unselected pixels along the same selected cathode (C1, C2, or C3), the difference between the unselected active electrodes is approximately 0 V. Therefore, substantially no current flows between the unselected active electrodes within each unselected pixel along the same cathode. The unselected cathodes are allowed to electrically float, effectively forming an open circuit.

The dummy electrodes DE1-DE4 are typically biased to substantially the same potential of the unselected anodes or to a lower potential. In this specific example, the dummy electrodes are all biased to approximately −10V. The dummy electrodes more strongly attract the positively charged mobile ions compared to the anodes because of the lower potential. However, some reverse bias current may occur in unselected pixels along a selected cathode, but such reverse bias current is relatively small compared to the forward biased OLED structures. If keeping current flow to the organic electronic device is to be kept as low as possible, the dummy electrodes may be biased to approximately −9 V, which is substantially the same as the unselected anodes.

The biasing of the anodes (A1, A2, and A3) and a selected cathode (C1, C2, or C3) occurs simultaneously during at least one point in time. Whether the selected anodes or the selected cathodes are activated one before the other is not important. However, the biasing of the anodes for a specific selected cathode (e.g., C2) should be activated after the prior selected cathode (e.g., C1) is deactivated (becomes unselected) and before the next cathode (e.g., C3) is activated (becomes selected). The dummy electrodes (DE1-DE4) are typically biased during operation of the array, but in another embodiment, may only be activated when any or all of the anodes (A1-A3) are unselected. In still another embodiment, the dummy electrodes (DE1-DE4) are only activated when any or all of the cathodes (C1-C3) are selected. Other timing schemes are possible and covering every possible combination would be nearly impossible.

Operating an actual display is slightly more involved but uses similar principles. For example, if the nine pixels are to represent an "X" on the display, A1 and A3 may be biased to approximately +3 V, and A2 may be biased to approximately −9 V when C1 is biased to approximately −9 V and C2 and C3 electrically float. Next, A2 may be biased to approximately +3 V, and A1 and A3 may be biased to approximately −9 V when C2 is biased to approximately −9 V and C1 and C3 electrically float. Finally, A1 and A3 may be biased to approximately +3 V, and A2 may be biased to approximately −9 V when C3 is biased to approximately −9 V and C1 and C2 electrically float. The conductive leads 18 and 28 may be electrically connected to a conventional row array strobe to allow the pulsing of the conductive members 42 (corresponding to C1, C2, and C3). Other conventional circuitry may be electrically connected to conductive members 12 (corresponding to A1, A2, and A3) to activate the proper pixels along each row as its corresponding conductive member 42 is selected. The pulsing and logic are designed to operate at a frequency such that the image appears to be static as seen by a human. Therefore, each of C1, C2, and C3 are selected at least 50 times per second.

The dummy electrodes DE1-DE4 are typically biased to a relatively constant potential. In other embodiments, a time varying or other non-constant potential may be used during operation of the organic electronic device. If a time-varying or other non-constant potential is used for the dummy electrodes DE1-DE4, its average potential over time should be about the same as or lower than the potential of an unselected anode A1, A2, or A3.

The operation of the embodiment illustrated in FIGS. 6-8 is similar except that the conductive member 62 is a single dummy electrode for the array. The biasing or electrically floating of A1-A3 and C1-C3 are substantially the same as previously described.

Within each selected pixel during operation, holes are injected into the organic active layer 34 by the conductive members 12 via hole-transport layer 32, and electrons are injected into the organic active layer 34 by the conductive members 42. When electron-hole pairs combine within the organic active layer 34, light or other radiation may be emitted from the electronic device. In a display, rows and columns can be given signals to activate the appropriate pixels (electronic devices) to render a display to a viewer in a human-understandable form.

Much of the focus has been on displays, however, the principles may also be used for other types of organic electronic devices. For a radiation detector, sense amplifiers may be coupled to the anodes A1-A3 or the cathodes C1-C3 of the array. A potential may be maintained between the conductive members 12 and 42 to allow better current flow to and from the peripheral circuitry. In one non-limiting example, a potential difference in a range of approximately 0.5 to 1.5 V may be maintained across the organic active layer 34. A relatively small amount of current may flow through the organic active layer 34. When radiated by light or another radiation source, sufficient energy may be received by the organic active layer 34 to significantly increase the number of electrons and holes within the organic active layer 34 and substantially increase the flow of current to or from the sense amplifier.

The sense amplifiers may be used to determine the current, and other peripheral (within the same component) or remote (not within the same component) circuitry can be used to interpret the information from the amount of current increase. This information may be in a digital or analog form. Such information may be used to create derivative information, such as imaging maps or other visual information. If the detector is designed to be sensitive to infrared radiation, an array of radiation detectors can be used to map temperature differences across the surface of the detector or temperature differences between objects spaced apart from the detectors. Alternatively, such a detector can be used to detect the presence of a flame (light or infrared radiation) for a fire alarm, or to determine ultraviolet radiation intensity from sunlight passing through relatively thin stratus clouds, for example.

Note that the biasing of the dummy electrodes DE1-DE4 may still occur, but the potential used may be closer to 0 V compared to the display embodiment previously described. The dummy electrodes DE1-DE4 may be placed at the lower of the potentials for: (1) the anodes A1-A3 and (2) cathodes C1-C3. Alternatively, the dummy electrodes DE1-DE4 may be placed at a lower potential than any of the anodes A1-A3 and cathodes C1-C3 during operation of the array. Assume that a radiation detector operates with selected conductive members DE1-DE4 at 0 V and 1.0 V, respectively, and unselected cathodes C1-C3 are allowed to electrically float. The dummy electrodes DE1-DE4 may be biased to approximately −1.0 V to 0 V so as to not interfere as much with the operation compared to the −10V used in the display embodiment.

For a voltaic cell, light or other radiation can be converted to energy that can flow without an external energy source. An electrical load or storage device (i.e., a battery) may be electrically connected to the anodes A1-A3 and cathodes C1-C3 and operate or store energy based at least in part on the current generated by the voltaic cell. The dummy electrodes DE1-DE4 should be biased at or near the lower potential of the anodes A1-A3 and cathodes C1-C3.

The dummy electrodes, which physically correspond to the structures having conductive members 14 and 24 and schematically correspond to DE1-DE4, can be used to attract mobile ions away from active electrodes. In one embodiment, the dummy electrodes can be used to attract mobile ions that may lie near the anodes (conductive members 12 and A1-A3). In this manner, unselected anodes will be less likely to accumulate mobile ions. Therefore, the wide column as seen when an unselected anode becomes a selected anode should be significantly less.

The integration of the dummy electrodes into an array can be achieved by changing the layout without the need to add a new layer, a new processing step, or introduce a new material. The change can be implemented by changing a design of mask(s) that are already used to form conductive members 12 and 18 (to include conductive members 14) and form conductive members 28 (to include conductive members 24). Therefore, qualifying the change may not be necessary or may only involve a relative simple qualifying process.

In an alternative embodiment, the dummy electrode, which physically corresponds to conductive member 62, can be used as a dummy electrode similar to the dummy electrodes DE1-DE4. Its placement can be at a location corresponding to the array but not lie laterally between active electrodes (e.g., conductive members 12). Therefore, a small array can be achieved and still receive the benefits as seen with dummy electrodes in another embodiment.

In some embodiments, the devices can also include a mobile ion getting material, which can be deposited as a getter layer. The mobile ion getting material, or getter layer, can effectively act as a trap for mobile ions and reduce the likelihood that they will migrate to a location within the device that would significantly interfere with the operation of the organic electronic device.

The electronics used to bias the dummy electrodes can be relatively simple, particularly if the dummy electrodes are placed at a substantially constant potential during operation. This can reduce the need for complicated logic circuits with strict timing constraints.

The new compositions and their uses are further described in greater detail by the following non-limiting examples.

EXAMPLES

Example 1

General Test Method

The wide column experiment can be performed as follows. An electrical schematic of a wide column defect experiment is given in Scheme 1, below.

Scheme 1. Electrical schematic of the wide column defect test

Glass/ITO substrates having an ITO thickness of about 100 nm to 150 nm is used. The ITO is patterned into parallel lines about 370 μm wide, which are spaced about 50 μm apart. As part of the pattern, dummy electrodes are placed along the same plane as the deposited ITO, as shown in FIGS. 1-5. The ITO line-dummy electrode plates are then spin-coated with a photo-resist and subsequently patterned into mushroom-shaped lines perpendicular to the ITO lines-dummy electrodes. Adjacent mushroom lines are spaced 370 μm apart; thereby forming pixels having the dimension of 370 μm×370 μm. The substrates with patterned ITO-dummy electrodes and mushroom lines are cleaned and subsequently treated with UV ozone. The buffer layer is spin-coated onto the ITO-dummy electrodes/mushroom/glass substrates to a thickness of about 200 nm. The spin-coated films are then baked at 90° C. in vacuum for 30 minutes.

For the light-emitting layer, a 1% (w/v) toluene solution of a polyphenylene vinylene polymer (Super Yellow from Covion, Frankfurt, Germany) is spin-coated on top of the dried buffer layer and subsequently baked at 130° C. in nitrogen for 30 minutes, having a final thickness of about 70 nm. Immediately thereafter, a 3.0 nm thick barium layer and 350 nm thick aluminum layer are deposited on the emitter layer to serve as a cathode. The mushroom lines are there to prevent cathodes to join together. A glass cover is placed over the device to protect it from oxygen and moisture.

A forward bias of 3.5 volts is applied across all the device cathodes and anodes, and a photograph is taken. This serves as the "base photograph".

The forward bias across the device is turned off and +14 Volts DC (Direct Current) electrical bias is applied to the first anode column visible in the base photograph, while the second anode column, adjacent to the first anode column and also visible in the base photograph, is connected to the electrical ground. The remainder of the cathodes and anodes are left electrically floating. The electrical bias between the two anode columns is maintained on for 64 hours and the electrical current between the 2 columns is recorded at the start and at the finish of applying the bias. The electrical bias between the two anode columns is then removed and immediately after, a forward bias of 3.5 volts is applied across all the device cathodes and anodes. At this point, the "final photograph" is taken.

The base and final photographs are visually compared to determine the magnitude of the "wide column gap defect" or "WCG defect." The defect is evaluated and given a "WCG Severity Rating" on a scale of 0 to 5, where 0 indicated no defect and 5 indicated a severe defect.

The term "effective for limiting wide column gap defect" or "effective for limiting WCG defect" refers to the effect of patterning dummy electrodes alongside the active electrodes while forming OLEDs. The outward result of "effective for limiting wide column gap defect" is the lack of visibility of the dark spots associated with wide column gap defect, as seen by the human eye. This effect can be determined by routine experimentation by one of ordinary skill using the general test method provided in Example 1, above.

Note that not necessarily all of the processes described above in the general description or the examples are required, that a portion of a specific process may not be required, and that one or more further processes may be performed in addition to those described. Still further, the order in which processes are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims, below. Accordingly, the specification and figures are to be regarded in an illustrative rather than a restrictive sense, and all such modifications are intended to be included within the scope of the invention.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

The invention claimed is:

1. An organic electronic device comprising at least one dummy electrode adjacent to at least one pair of active electrodes of the same polarity,
    wherein the dummy electrode is biased so that an electric potential difference exists between the dummy electrode and a selected one of the pair of active electrodes that is equal to or greater than the electric potential difference between the selected one and an unselected one of the pair of active electrodes.

2. The organic electronic device of claim 1, wherein the at least one dummy electrode adjacent to at least one pair of active electrodes is at a distance at which the dummy electrode and one active electrode of the pair generate an electric potential difference.

3. The organic electronic device of claim 1, wherein the electric potential difference generated between the dummy electrode and the selected one of the pair of active electrodes draws cations from near the pair of active electrodes to the dummy electrode.

4. The organic electronic device of claim 3, wherein the pair of active electrodes are anodes.

5. The organic electronic device of claim 4, wherein the dummy electrode and the anode have substantially same composition.

6. The organic electronic device of claim 3, wherein the dummy electrode is comprised of a conductive layer distinct from a layer having the pair of active electrodes.

7. The organic electronic device of claim 3, wherein the dummy electrode is between the pair of active electrodes.

8. The organic electronic device of claim 3 further comprising a getter layer.

9. An organic electronic device comprising a plurality of dummy electrodes and a plurality of active electrodes of the same polarity, wherein the dummy electrodes and the plurality of active electrodes are substantially interdigitated with respect to each other and
    wherein each of the dummy electrodes is located between one of the plurality of active electrodes that is selected and another one of the plurality of active electrodes that is unselected.

10. The organic electronic device of claim 9, wherein each of the dummy electrodes generates an electric potential difference with the one selected active electrode which is equal to or greater than an electric potential difference generated between the one selected active electrode and the one unselected active electrode.

11. The organic electronic device of claim 10, wherein the electric potential difference generated between the dummy electrode and the one selected active electrode draws cations towards the dummy electrode from near the surrounding selected active electrodes.

12. The organic electronic device of claim 11, wherein the active electrodes are anodes.

* * * * *